United States Patent

[11] 3,597,658

[72] Inventor John Rivera
Raritan, N.J.

[21] Appl. No. 880,328
[22] Filed Nov. 26, 1969
[45] Patented Aug. 3, 1971
[73] Assignee RCA Corporation

[54] HIGH CURRENT SEMICONDUCTOR DEVICE EMPLOYING A ZINC-COATED ALUMINUM SUBSTRATE
4 Claims, 1 Drawing Fig.

[52] U.S. Cl. 317/234 R, 317/234 A, 317/234 J, 317/234 L, 317/234 M, 29/195.5, 29/183, 313/355
[51] Int. Cl. H01l 3/00, H01l 5/00
[50] Field of Search 317/234, 235, 3, 3.1, 4, 4.1, 5, 5.3, 101 A; 313/355; 29/195.5, 183.5; 1/197, 472.3, 493, 497, 497.5, 498, 504

[56] References Cited

UNITED STATES PATENTS

| | | | |
|---|---|---|---|
| 2,320,998 | 6/1943 | Beebe | 29/197 X |
| 2,473,888 | 6/1949 | Jordan et al. | 313/355 X |
| 3,283,224 | 11/1966 | Erkan | 317/234 |
| 3,486,892 | 12/1969 | Rosvold | 317/235 X |
| 3,512,027 | 5/1970 | Kupsky | 317/234 X |

FOREIGN PATENTS

| | | | |
|---|---|---|---|
| 1,015,560 | 1/1966 | Great Britain | 317/234 |

*Primary Examiner*—John W. Huckert
*Assistant Examiner*—Andrew J. James
*Attorney*—Glenn H. Bruestle

ABSTRACT: The device structure includes a zinc layer on an aluminum substrate, and a layer of nickel on the zinc layer. A pedestal member which has a semiconductor device mounted thereon, is joined to the nickel with a brazing material which has a melting temperature below that of the aluminum substrate, and wets well to nickel.

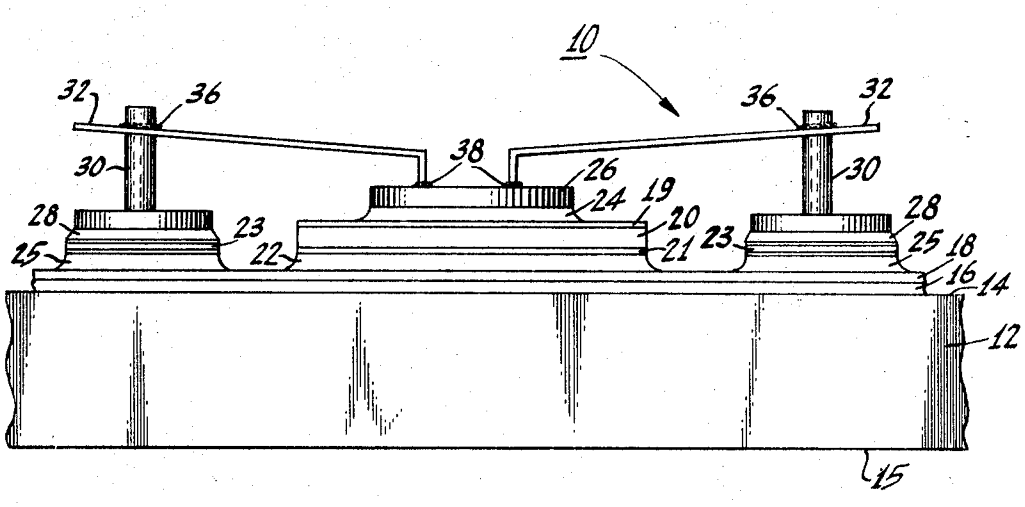
INVENTOR.
JOHN RIVERA
BY Glenn H. Bruestle
Attorney

HIGH CURRENT SEMICONDUCTOR DEVICE EMPLOYING A ZINC-COATED ALUMINUM SUBSTRATE

BACKGROUND OF THE INVENTION

The invention herein disclosed was made in the course of, or under contract or subcontract thereunder, with the Department of the Air Force.

The present invention relates to semiconductor devices, and more particularly, relates to high current semiconductor device structures employing aluminum substrates.

In the manufacture of high current semiconductor devices, e.g., power transistors, the device is usually soldered to a highly conductive substrate which has a thermal expansion coefficient closely matching that of the device. For some devices, it is also desirable to employ a mounting, or pedestal member between the device and the substrate for better thermal expansion matching, or to electrically isolate the device from the metal substrate. Typically, molybdenum is used for thermal expansion matching, and either beryllia or alumina is used when electrical isolation is required.

Copper has proven to be an excellent substrate material for individual high current semiconductors, and is widely employed in the industry. However, copper is a relatively heavy metal, and its weight is a serious disadvantage when used in hybrid power circuits which employ several large current devices; this is especially true in aircraft and aerospace applications where weight is a critical factor.

Aluminum is relatively light, has suitable thermal and electrical characteristics, and, thus, is a desirable alternative for copper in these applications; but most commercial grades of aluminum melt at temperatures between 600° and 660° C. In the fabrication of semiconductor device structures which include a pedestal member, processing steps are often carried out at temperatures in excess of 600° C.; thus, aluminum has not heretofore been widely used as a substrate material.

Summary of the Invention

A semiconductor device structure comprising an aluminum substrate having a major surface, a zinc layer on the surface, and a layer of nickel on the zinc layer. The structure also includes a pedestal member on which a semiconductor device is mounted, having two opposed major surfaces, with a first one of the surfaces joined to the nickel-plated surface of the aluminum substrate with a joint of a brazing material which wets well to the surface of the pedestal member, and melts at a temperature below the melting temperature of the aluminum substrate.

The invention also includes a method for making the structure.

The Drawing

The single FIG. of the drawing is a side view of a power transistor constructed in accordance with the present invention.

Detailed Description

An example of the structure will be described with reference to the drawing, which illustrates a power transistor.

The power transistor structure includes an aluminum substrate, a pedestal member, means for joining the pedestal member to the aluminum substrate, and active power transistor chip joined to the pedestal member, and means for making contact to the chip.

The power transistor structure 10 comprises an aluminum substrate 12 having opposed upper and lower surfaces 14 and 15, respectively, a zinc layer 16 on the upper surface 14, and a nickel layer 18 on the zinc layer 16. The dimensions of the aluminum substrate 12, and the thickness of the zinc and nickel layers 16, 18 are not critical; preferably, however, the zinc layer 16 is at least 100.0 microns thick, and the nickel layer 18 is between 100.0 and 200.0 microns thick.

The structure 10 also includes a pedestal member 20 having opposed upper and lower surfaces. The pedestal member 20 may comprise a refractory metal, such as molybdenum, when thermal expansion matching is desired, or may comprise a suitable insulating material, such as beryllia (BeO) or alumina ($Al_2O_3$) when electrical isolation between the pedestal member 20 and the aluminum substrate 12 is required. In this example, the pedestal member 20 comprises a body of beryllia, the dimensions of which are not critical; suitably, however, the pedestal member 20 is between 30.0 and 50.0 mils thick. The upper and lower surfaces of the pedestal member 20 are nickel-plated with layers 19 and 21, respectively.

The lower nickel layer 21 of the pedestal member 20 is joined to the nickel layer 18 on the substrate 12 with a joint 22 of a brazing material which wets nickel well, and melts at a temperature below the melting temperature of the aluminum substrate 12. The thickness of the braze joint 22 is not critical, but preferably is at least 1.0 mils thick.

A power transistor chip 26 is joined to the upper nickel layer 19 of the pedestal member 20 with a solder joint 24 of any one of the well-known lead or lead-tin solders. Terminal post insulating pads 23 are joined to the nickel layer 18 by a braze joint 25 of a brazing material like that of the braze joint 22 between the pedestal member 20 and the aluminum substrate 12. In this embodiment, the pads 23 comprise a wafer of beryllia having nickel-plated upper and lower surfaces, which are shown, but not numbered in the drawing. Metal terminal posts 30 are joined to the insulating pads 23 with a solder joint 28. The structure 10 is completed with metal clips 32 which interconnect the terminal posts 30 with the semiconducting regions (not numbered) of the device 26. Solder joints 36, 38 insure electrical contact between the posts 30 and the clips 32, and between the clips 32 and the device 26, respectively.

Example

An example of the method of the present invention, as employed to mount several power transistors to an aluminum substrate, will now be described. The starting material was a body of aluminum, commercial grade 1100, which was 3.0 inch long, 1.25 inches wide, and 0.25 inch thick. Grade 1100 is a relatively pure aluminum which melts at a temperature of about 620° C. The surface of the substrate was lightly etched with an alkaline etchant, consisting of a solution of sodium hydroxide and trisodium phosphate ($Na_3PO_4$) for 2 minutes at 66° C., in order to prepare the surface for anodizing. After etching, a black oxide was left deposited on the substrate, this deposit was removed using an acid cleaning solution, The substrate was then rinsed and dried.

Next, the substrate was anodized by immersing it into a 95.0 cc./liter solution of sulfuric acid for one-half hour while maintaining a 15 volt potential therein. After a rinse, the substrate was boiled in a 45.0 grams/liter solution of sodium dichromate ($Na_2Cr_2OB7$) for 10 minutes, to complete the anodization step.

The anodization was then selectively removed from the surface where the devices were to be mounted, by brushing a vinyl lacquer onto the surfaces where anodization was to remain, and allowing the lacquer to dry. The anodization was then removed from the exposed surface of the substrate by using an etchant which consisted of the following: a hot solution (above 90° C.) of 20.0 cc. of phosphoric acid ($H_3PO_4$) in 980.0 cc. of water, with 20.0 grams of chromium trioxide $cro_3$) added.

After the anodization removal step, the substrate was again rinsed and dried.

A thin layer of zinc, about 100 microns thick, was then deposited onto the selectively etched surface of the aluminum substrate. This was accomplished by immersing the substrate in a zincate coating solution for 75 seconds, and allowing the substrate to dry.

Next, the zinc layer was nickel-plated by treating the substrate with an electroless nickel solution for one-half hour, at 82° C. The lacquer mask was then stripped away with a methyl ethyl ketone solvent, and the nickel was sintered at 500° C. in a hydrogen reducing atmosphere for 1 minute.

Thereafter, a molybdenum pedestal member for each transistor was jigged and brazed to the nickel plated portions of the surface of the aluminum substrate, with a brazing material which wets well to the surface of the pedestal member, and melts at a temperature below the melting temperature of the aluminum substrate. Each molybdenum pedestal member had been previously nickel-plated on both upper and lower surfaces. The brazing material was an alloy consisting essentially of 38 percent gold, 17 percent germanium, and 45 percent silver, by weight. This alloy melts at a temperature of approximately 525° C., and wets well to copper, nickel, and gold- or nickel-plated molybdenum, beryllia, and alumina. The brazing step was carried out in a reducing atmosphere to avoid the need for an external flux. A silicon power transistor chip was then lead soldered to each molybdenum pedestal member.

The method of the present invention allows high current semiconductor devices to be brazed to aluminum substrates at processing temperatures below the melting point of the aluminum substrate; and, after the brazing step is completed, further high temperature soldering and chemical processing may take place without materially disturbing the brazing joint.

What I claim is:

1. A semiconductor device structure, comprising:

an aluminum substrate having a major surface;

a layer of zinc on said surface;

a layer of nickel on said zinc layer;

a pedestal member having first and second surfaces;

said first surface of said pedestal member being joined to said nickel layer with a brazing material which wets well to said first surface, and which melts at a temperature below the melting temperature of the aluminum substrate, and a semiconductor device mounted on said second surface of said pedestal member and bonded thereto.

2. A structure according to claim 1, wherein said pedestal member comprises a material selected from a group consisting of molybdenum, beryllia, and alumina, coated with nickel.

3. A structure according to claim 1, wherein said brazing material consists essentially of 38 percent gold, 17 percent germanium, and 45 percent silver, by weight.

4. A structure according to claim 1, in which said semiconductor device is a transistor which is soldered to the second one of the surfaces of said pedestal member.